US012476200B2

(12) United States Patent
Lu

(10) Patent No.: US 12,476,200 B2
(45) Date of Patent: Nov. 18, 2025

(54) SEMICONDUCTOR STRUCTURE AND MANUFACTURING METHOD OF SEMICONDUCTOR STRUCTURE

(71) Applicant: CHANGXIN MEMORY TECHNOLOGIES, INC., Hefei (CN)

(72) Inventor: Zhiyuan Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 425 days.

(21) Appl. No.: 18/161,126

(22) Filed: Jan. 30, 2023

(65) Prior Publication Data

US 2024/0047371 A1 Feb. 8, 2024

(30) Foreign Application Priority Data

Aug. 5, 2022 (CN) ......................... 202210938684.4

(51) Int. Cl.
*H01L 21/311* (2006.01)
*H01L 23/544* (2006.01)

(52) U.S. Cl.
CPC ...... *H01L 23/544* (2013.01); *H01L 21/31144* (2013.01); *H01L 2223/54426* (2013.01)

(58) Field of Classification Search
CPC ............. H01L 23/544; H01L 21/31144; H01L 2223/54426; H01L 2223/5446
See application file for complete search history.

(56) References Cited

U.S. PATENT DOCUMENTS

2005/0090120 A1* 4/2005 Hasegawa ................. G03F 1/50 438/738

FOREIGN PATENT DOCUMENTS

CN 113097142 A 7/2021

* cited by examiner

*Primary Examiner* — Walter H Swanson
(74) *Attorney, Agent, or Firm* — Syncoda LLC; Feng Ma

(57) ABSTRACT

A manufacturing method of a semiconductor structure includes: providing substrate including array area and peripheral area, where peripheral area includes mark area and blank area adjoining mark area; forming, on substrate, target layer and first core layer disposed on target layer, first core layer including first array core layer disposed on array area, first mark core layer disposed on mark area and first cap layer disposed on blank area, where first cap layer has inclined sidewall, and its top dimension is smaller than its bottom dimension; forming first dielectric layer covering sidewall of first core layer; forming first filling layer covering surface of first dielectric layer and filling gap in first core layer; and etching first dielectric layer and target layer along sidewalls of first array core layer and first mark core layer to transfer pattern of first core layer and pattern of first filling layer to target layer.

10 Claims, 29 Drawing Sheets

SEMICONDUCTOR STRUCTURE AND MANUFACTURING METHOD OF SEMICONDUCTOR STRUCTURE

CROSS-REFERENCE TO RELATED APPLICATION

The application claims priority to Chinese Patent Application No. 202210938684.4, filed on Aug. 5, 2022, the disclosure of which is hereby incorporated herein by reference in its entirety.

BACKGROUND

With further reduction of the dimension of a semiconductor structure, in order to increase the integration density of semiconductor structure, Reverse Self-aligned Double Patterning (R-SADP), Reverse Self-aligned Quadruple Patterning (R-SAQP) and other processes have been introduced into the manufacturing process of the semiconductor structure. Taking R-SADP process as an example, it usually includes forming multiple core layers on a target material layer to be etched, forming a dielectric layer covering a sidewall and an upper surface of the core layer and a spin-coated hard mask layer covering the dielectric layer, and then etching the target material layer below the spin-coated hard mask layer and the core layer with the spin-coated hard mask layer and the core layer as a mask.

However, the distribution of core layers is often uneven, and in an area where the core layers are sparsely distributed, recesses are usually formed on the upper surface of the spin-coated hard mask layer. When the target material layer is etched with the spin-coated hard mask layer and the core layer as the mask, over-etching is easy to occur in concave areas on the upper surface of the spin-coated hard mask layer, which leads to errors of pattern transfer and damages to the bottom layer. In serious cases, the reliability and yield of the chip will be reduced.

SUMMARY

The disclosure relates to the field of semiconductor manufacturing, and in particular to, a semiconductor structure and a manufacturing method of a semiconductor structure.

The embodiments of the present disclosure provide a manufacturing method of a semiconductor structure, including: providing a substrate including an array area and a peripheral area, where the peripheral area includes a mark area and a blank area adjoining the mark area; forming, on the substrate, a target layer and a first core layer disposed on the target layer, the first core layer including a first array core layer disposed on the array area, a first mark core layer disposed on the mark area and a first cap layer disposed on the blank area, where the first cap layer has an inclined sidewall, and a top dimension of the first cap layer is smaller than a bottom dimension of the first cap layer; forming a first dielectric layer covering a sidewall of the first core layer r; forming a first filling layer that covers a surface of the first dielectric layer and fills a gap in the first core layer; and etching the first dielectric layer and the target layer along a sidewall of the first array core layer and a sidewall of the first mark core layer to transfer a pattern of the first core layer and a pattern of the first filling layer to the target layer.

Embodiments of the present disclosure also provide a semiconductor structure including: a substrate, including an array area and a peripheral area, where the peripheral area includes a mark area and a blank area adjoining the mark area; a target layer and a first core layer disposed on the target layer, the first core layer including a first array core layer disposed on the array area, a first mark core layer disposed on the mark area and a first cap layer disposed on the blank area, where the first cap layer has an inclined sidewall, and a top dimension of the first cap layer is smaller than a bottom dimension of the first cap layer; a first dielectric layer covering a sidewall of the first core layer; and a first filling layer disposed on the first dielectric layer and in the first core layer.

Details of one or more embodiments of the present disclosure are set forth in the following drawings and description. Other features, objects and advantages of the present disclosure will become apparent from the specification, drawings and claims.

BRIEF DESCRIPTION OF THE DRAWINGS

One or more embodiments are exemplarily illustrated by the corresponding drawings. These exemplary descriptions do not limit the embodiments. Unless otherwise stated, the pictures in the drawings do not limit the scale. In order to describe the technical solutions of the embodiments of the present disclosure more clearly, drawings required to be used in the embodiments of the present disclosure will be briefly introduced below. Apparently, the drawings described below are only some embodiments of the present disclosure. Those of ordinary skill in the art also can obtain other drawings according to these drawings without doing creative work.

DETAILED DESCRIPTION

Figure 1:
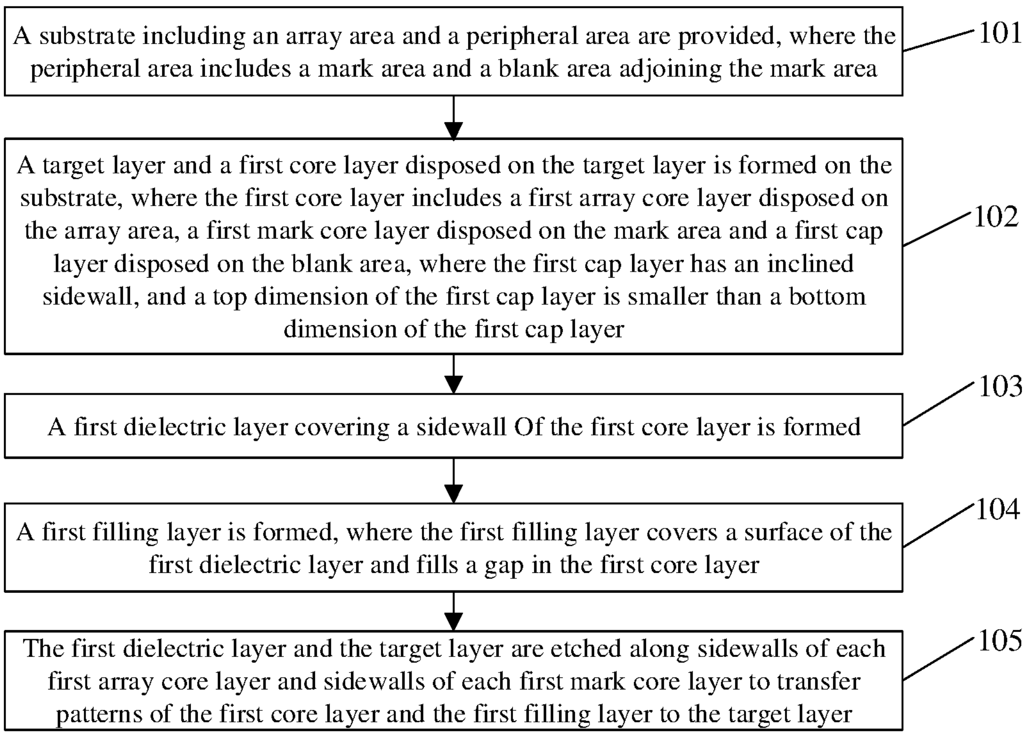
FIG. 1 is a flowchart of a manufacturing method of a semiconductor structure according to an embodiment of the present disclosure.

Exemplary implementations of the disclosure will be described below more comprehensively with reference to the drawings. Although the exemplary implementations of the disclosure are shown in the drawings, it should be understood that, the disclosure may be implemented in various forms and should not be limited by the specific implementations elaborated herein. On the contrary, these implementations are provided to enable a more thorough understanding of the disclosure and to fully convey the scope of the disclosure to those skilled in the art.

In the following description, a large number of specific details are given in order to provide a more thorough understanding of the disclosure. However, it will be apparent to those skilled in the art that the disclosure may be implemented without one or more of these details. In other examples, in order to avoid confusion with the disclosure, some technical features known in the art are not described. That is, all the features of the actual embodiments are not described herein, and the known functions and structures are not described in detail.

In the drawings, the dimensions of layer, areas and elements and their relative dimensions may be exaggerated for clarity. The same drawing signs represent the same elements throughout.

It is to be understood that description that an element or layer is "above", "adjacent to", "connected to", or "coupled to" another element or layer may refer to that the element or layer is directly above, adjacent to, connected to or coupled to the other element or layer, or there may be an intermediate element or layer. On the contrary, description that an element is "directly on", "directly adjacent to", "directly connected to" or "directly coupled to" another element or layer refers to that there is no intermediate element or layer. It is to be understood that, although various elements, components, areas, layer and/or parts may be described with terms "first", "second", "third", etc., these elements, components, areas, layer and/or parts should not be limited to these terms. These terms are used only to distinguish one element, component, area, layer or part from another element, component, area, layer or part. Therefore, a first element, component, area, layer or part discussed below may be represented as a second element, component, area, layer or part without departing from the teaching of the disclosure. However, when the second element, component, area, layer or part is discussed, it does not mean that the first element, component, area, layer or part must exist in the disclosure.

In order to conveniently describe, spatially relational terms such as "below", "under", "lower", "beneath", "above", and "upper" may be used herein for describing a relationship between one element or feature and another element or feature illustrated in the figure. It is to be understood that, in addition to the orientation shown in the figures, the spatially relational terms are intended to further include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both upper and lower orientations. The device may include otherwise orientation (rotation by 90 degrees or in other orientations) and the spatial descriptors used herein may be interpreted accordingly.

The terms used herein are intended only to describe specific embodiments and are not a limitation of the disclosure. As used herein, singular forms "a/an", "one", and "the" may also be intended to include the plural forms, unless otherwise specified forms in the context. It is also to be understood that, when terms "composed of" and/or "including" are used in this specification, the presence of the features, integers, steps, operations, elements, and/or components may be determined, but the presence or addition of one or more other features, integers, steps, operations, elements, components, and/or groups is also possible. As used herein, term "and/or" includes any and all combinations of the related listed items.

With the further reduction of the dimension of the semiconductor structure, in order to increase the integration density of semiconductor structure, R-SADP, R-SAQP and other processes have been introduced into the manufacturing process of semiconductor structure. Taking R-SADP process as an example, the R-SADP process usually includes forming multiple core layers on the target material layer to be etched, then forming a dielectric layer covering a sidewall and an upper surface of the core layer and a spin-coated hard mask layer covering the dielectric layer, and then etching the target material layer below the spin-coated hard mask layer and the core layer with the spin-coated hard mask layer and the core layer as a mask.

However, the distribution of core layers is often uneven, in an area where the core layers are sparsely distributed, recesses are usually formed on the upper surface of the spin-coated hard mask layer. When the target material layer is etched with the spin-coated hard mask layer and the core layer as the mask, over-etching is easy to occur in concave areas on the upper surface of the spin-coated hard mask layer, which leads to errors of pattern transfer and damages to the bottom layer. In serious cases, the reliability and yield of the chip will be reduced.

Based on these, the embodiments of the present disclosure propose the following technical scheme.

Embodiments of the present disclosure provide a manufacturing method of a semiconductor structure, and more specifically refer to FIG. 1. As shown in the figure, the method includes operations 101 to 105.

In operation 101, a substrate including an array area and a peripheral area are provided, where the peripheral area includes a mark area and a blank area adjoining the mark area.

In operation 102, a target layer and a first core layer disposed on the target layer is formed on the substrate. The first core layer includes a first array core layer disposed on the array area, a first mark core layer disposed on the mark area and a first cap layer disposed on the blank area, where the first cap layer has an inclined sidewall, and a top dimension of the first cap layer is smaller than a bottom dimension of the first cap layer.

In operation 103, a first dielectric layer covering a sidewall of the first core layer is formed.

In operation 104, a first filling layer is formed, where the first filling layer covers a surface of the first dielectric layer and fills a gap in the first core layer.

In operation 105, the first dielectric layer and the target layer are etched along a sidewall of the first array core layer and a sidewall of the first mark core layer to transfer a pattern of the first core layer and a pattern of the first filling layer to the target layer.

Specific embodiments of the present disclosure will be described in detail below with reference to the accompanying drawings. When the embodiments of the present disclosure are described in detail, the schematic diagram is not partially enlarged to a general scale for ease of illustration, and the schematic diagram is only an example, which should not limit the scope of protection of the present disclosure herein.

The manufacturing method provided by the embodiments of the present disclosure can be used for manufacturing a dynamic random access memory (DRAM). But not limited thereto, the manufacturing method can also be used for manufacturing any semiconductor structure.

Figure 2:
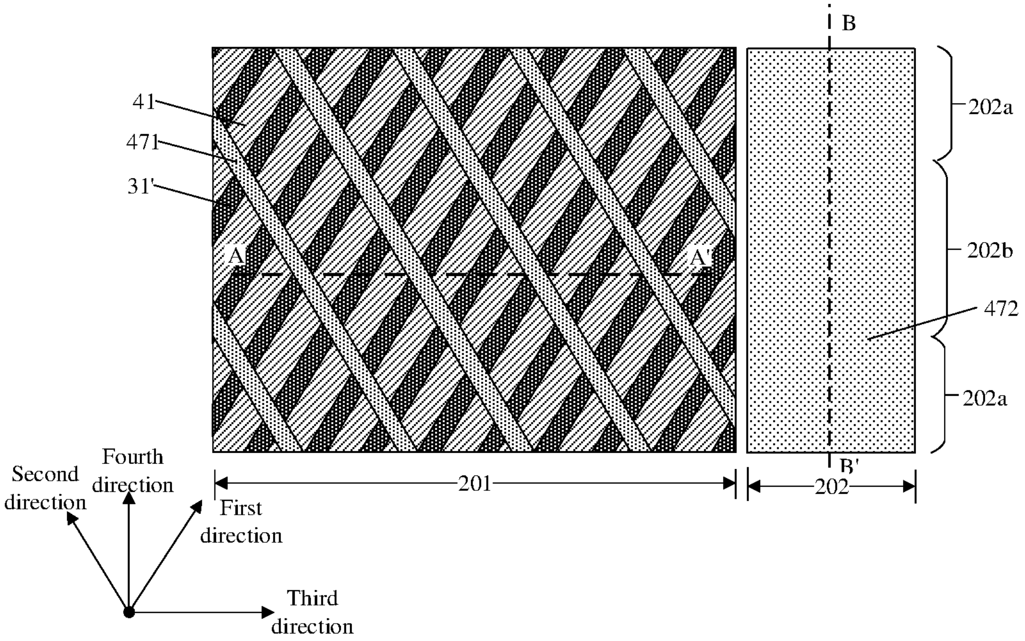
FIG. 2 to FIG. 29 are process flowcharts of a manufacturing method of a semiconductor structure according to embodiments of the present disclosure.

FIG. 2 to FIG. 29 are process flowcharts of a manufacturing method of a semiconductor structure according to embodiments of the present disclosure. FIG. 2 is a top view schematic diagram of the semiconductor structure, and FIG. 3 to FIG. 29 are cross-sectional structure schematic diagrams of each process operation taken along lines A-A' and B-B' in FIG. 2. The manufacturing method of a semiconductor structure provided by the embodiments of the present disclosure will be described in further detail below with reference to FIG. 2 to FIG. 29.

Figure 3:
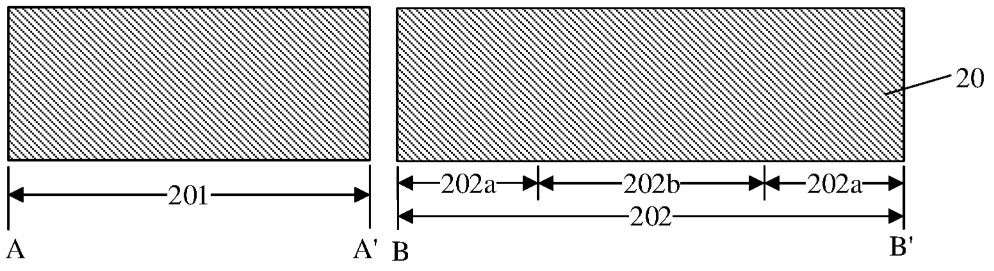

Firstly, the operation 101 is performed. As shown in FIG. 3, a substrate 20 including an array area 201 and a peripheral area 202 is provided, where the peripheral area 202 includes a mark area 202*a* and a blank area 202*b* adjoining the mark area 202*a*.

The substrate 20 may be a semiconductor substrate and may include at least one elemental semiconductor material (e.g. silicon (Si) substrate, germanium (Ge) substrate), at least one III-V compound semiconductor material, at least one II-VI compound semiconductor material, at least one organic semiconductor material, or other semiconductor materials known in the art. In one specific embodiment, the substrate 20 is the silicon substrate and the silicon substrate may be doped or may not be doped. In actual operation, the semiconductor structure is formed on the wafer, the mark area 202*a* may be disposed on the dicing channels of the wafer and alignment marks may subsequently be formed on the mark area 202*a*.

Secondly, the operation 102 is performed. As shown in FIG. 4 to FIG. 11, the target layer 31 and the first core layer 37 on the target layer 31 are formed on the substrate 20. The first core layer 37 includes a first array core layer 371 disposed on the array area 201, the first mark core layer 372 disposed on the mark area 202*a*, and a first cap layer 373 disposed on the blank area 202*b*. The first cap layer 373 has an inclined sidewall and a top dimension of the first cap layer 373 is smaller than a bottom dimension of the first cap layer 373. Specifically, an angle between a direction of the inclined sidewall and a direction parallel to the surface of the substrate 20 ranges from 20 degrees to 70 degrees.

The target layer 31 can be used as a mask layer, and the pattern of the upper layer can be transferred to the target layer 31, and then the pattern of the target layer 31 can be transferred to the next layer. The material of the target layer 31 includes but is not limited to an oxide, such as silicon oxide.

Specifically, the operation that the first core layer 37 on the target layer 31 is formed on the substrate 20 includes following operations.

Figure 4:
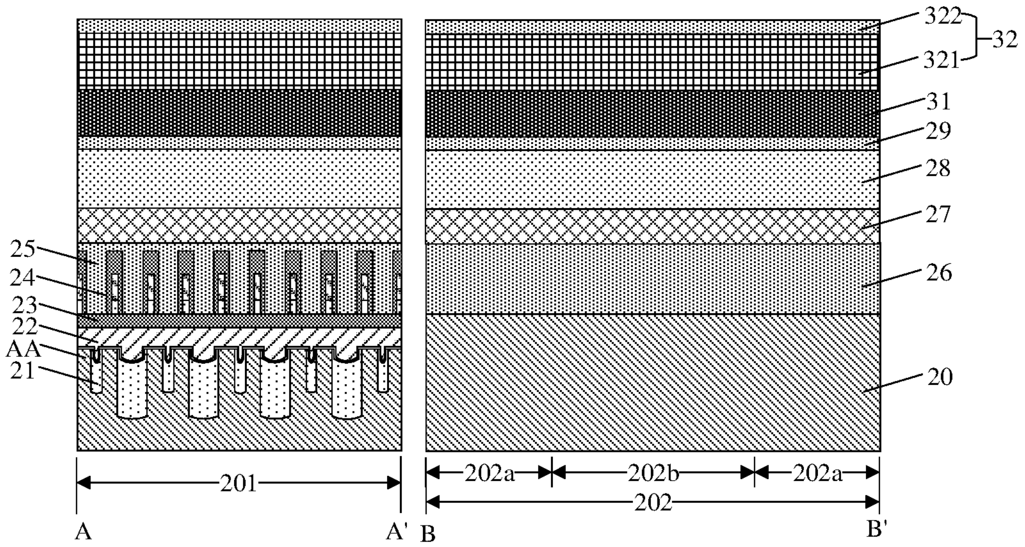

A first mask layer 32 is formed on the target layer 31 (as shown in FIG. 4).

A first mask pattern M1 is formed on the first mask layer 32. The first mask pattern M1 includes a first sidewall layer 35' disposed on the array area 201 and the mark area 202*a* and a second cap layer 343 disposed on the blank area 202*b*, where the second cap layer 343 has an inclined sidewall, and a top dimension of the second cap layer 343 is smaller than a bottom dimension of the second cap layer 343. Specifically, an angle between a direction of the inclined sidewall and the direction parallel to the surface of the substrate 20 ranges from 20 degrees to 70 degrees.

Figure 11:
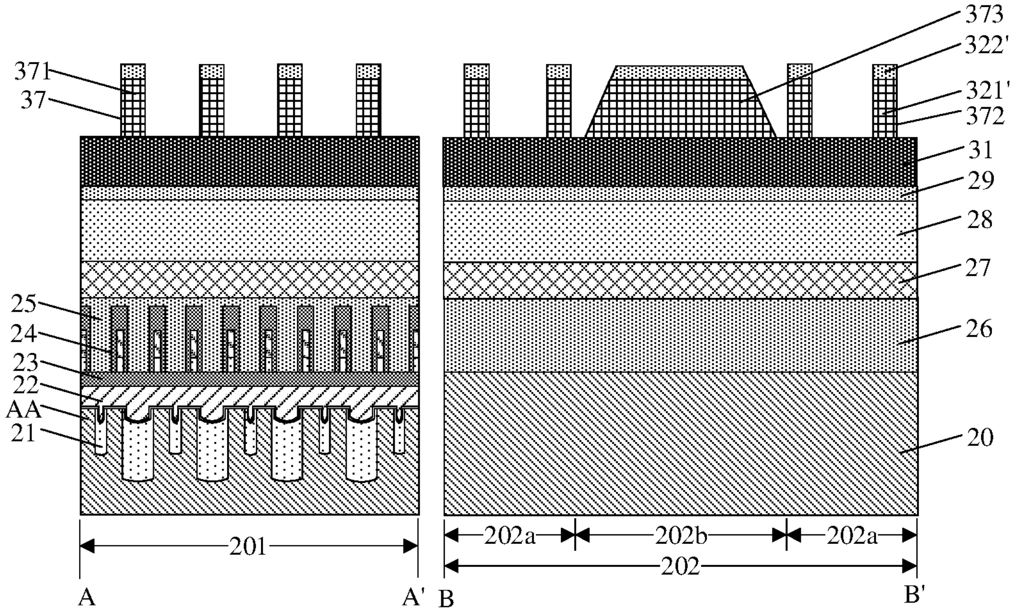

The first mask layer 32 is etched with the first mask pattern M1 as a mask to form the first array core layer 371, the first mark core layer 372 and the first cap layer 373 respectively on the array area 201, the mark area 202*a* and the blank area 202*b* (as shown in FIG. 11).

As shown in FIG. 4, in one embodiment, the first mask layer 32 includes an initial body layer 321 and an initial cap layer 322 on the initial body layer 321. As shown in FIG. 11, in the operation of etching the first mask layer 32 to form the first core layer 37, the initial body layer 321 is etched to form the body layer 321' and the initial cap layer 322 is etched to form the cap layer 322' covering an upper surface of the body layer 321'. The material of the initial body layer 321 may be a spin-coated hard mask layer including an amorphous carbon layer, an amorphous silicon layer or the like. The material of the initial cap layer 322 may be silicon oxynitride.

In some embodiments, the first sidewall layer 35', the first array core layer 371 on the array area 201 extends along a first direction, and the extension directions of the first sidewall layer 35' and the first mark core layer 372 on the mark area 202*a* may be identical to the extension direction of the first array core layer 371, or the extension directions of the first sidewall layer 35' and the first mark core layer 372 on the mark area 202*a* may be different from the extension direction of the first array core layer 371.

With reference again to FIG. 5 to FIG. 10, the operation that the first mask pattern M1 is formed on the first mask layer 32 includes the following operations.

Figure 5:
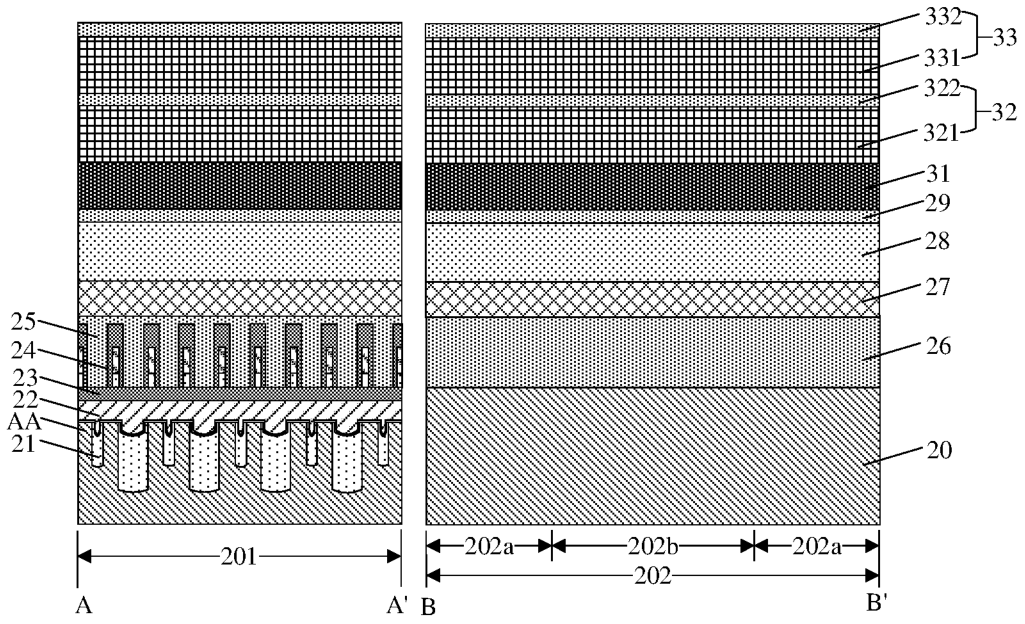

A second mask layer 33 is formed on the first mask layer 32 (as shown in FIG. 5).

Figure 6:
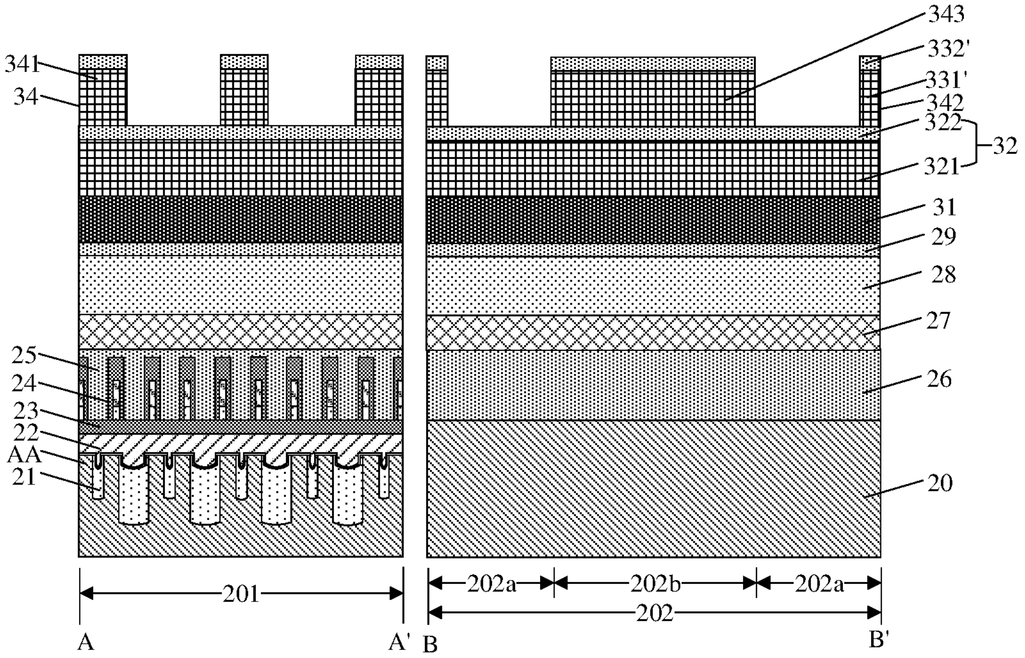

The second mask layer 33 is etched to form a second core layer 34, where the second core layer 34 includes a second array core layer 341 on the array area 201, a second mark core layer 342 on the mark area 202*a*, and a second initial cap layer 343 on the blank area 202*b* (as shown in FIG. 6). The second array core layer 341 extends along the first direction.

Figure 7:
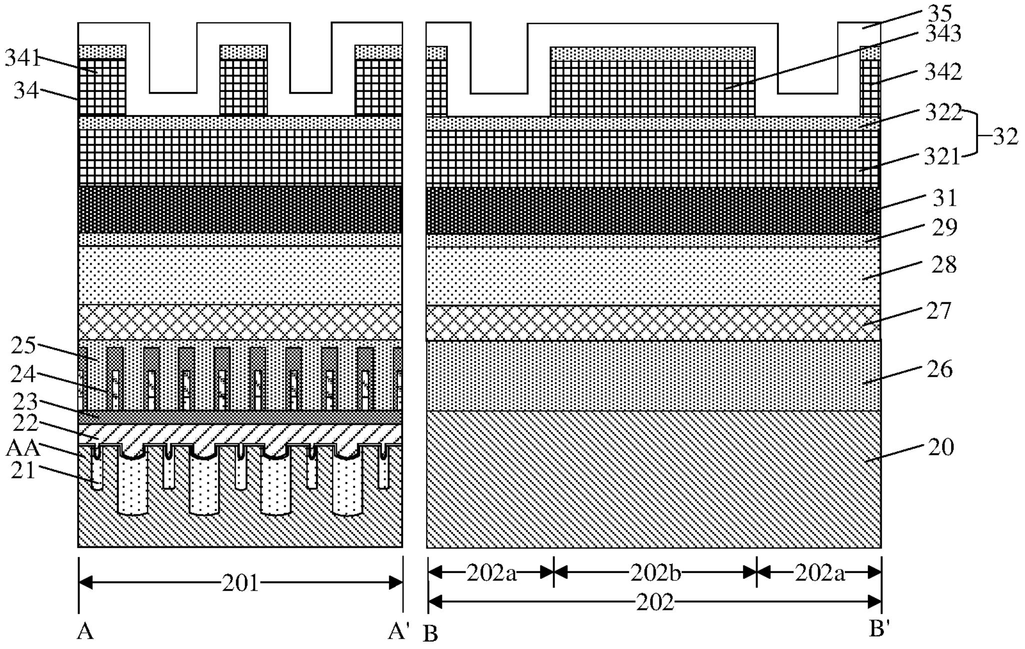

A second dielectric layer 35 is formed. The second dielectric layer 35 covers a sidewall and an upper surface of the second core layer 34 and an upper surface of the first mask layer 32 (as shown in FIG. 7).

Figure 8:
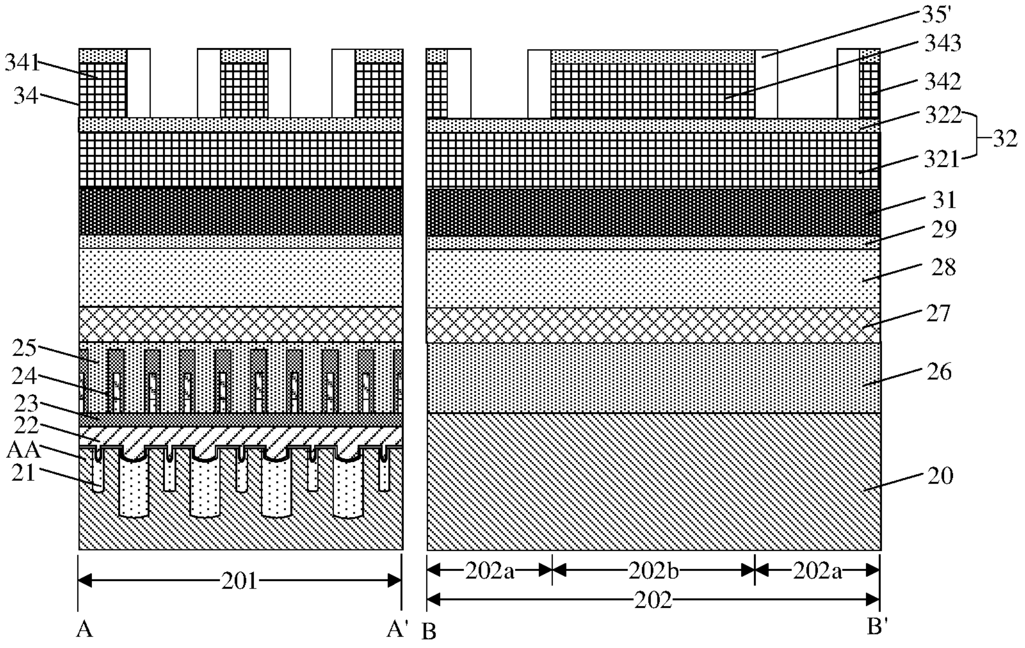

The second dielectric layer 35 is etched back to form the first sidewall layer 35' covering the sidewall of the second core layer 34 (as shown in FIG. 8).

Figure 9:
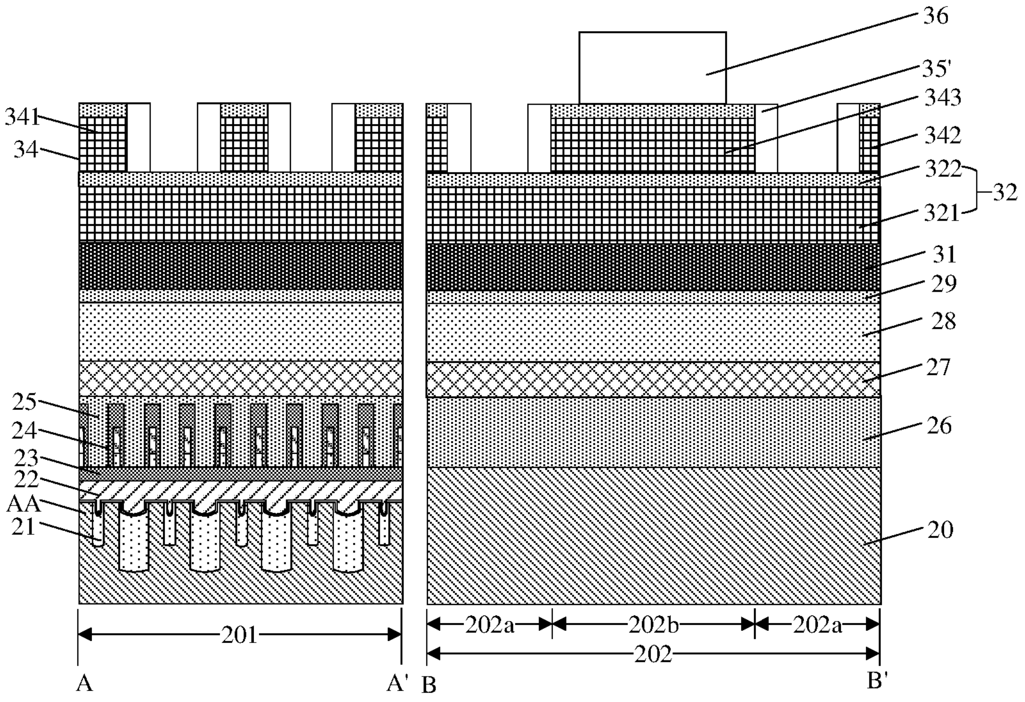

A first barrier layer 36 is formed. The first barrier layer 36 covers an intermediate area of the second initial cap layer 343 (as shown in FIG. 9).

Figure 10:
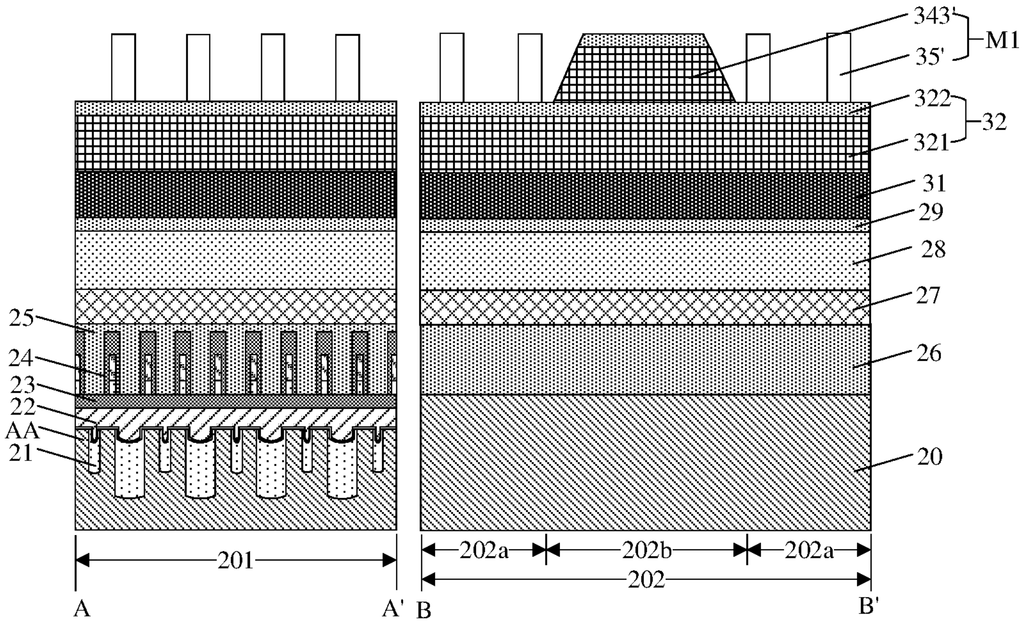

The second array core layer 341, the second mark core layer 342, and the second initial cap layer 343 are etched with the first barrier layer 36 as a mask, so as to remove the second array core layer 341 and the second mark core layer 342 and form the second cap layer 343 (as shown in FIG. 10).

As shown in FIG. 5, in one embodiment, the second mask layer 33 includes an initial body layer 331 and an initial cap layer 332 on the initial body layer 331. As shown in FIG. 6, in the operation of etching the second mask layer 33 to form the second core layer 34, the initial body layer 331 is etched to form the body layer 331' and the initial cap layer 332 is etched to form the cap layer 332' covering an upper surface of the body layer 331'. The material of the initial body layer 331 may be a spin-coated hard mask layer which may include the amorphous carbon layer or the amorphous silicon layer or the like. The material of the initial cap layer 332 may be silicon oxynitride. The material of the second dielectric layer 35 includes, but is not limited to, an oxide, such as silicon oxide.

In one embodiment, the second array core layer 341, the second mark core layer 342, and the second initial cap layer 343 may be etched by a dry etching process, which may be chemical gas etching. Specifically, the embodiments of the present disclosure adopt the scheme that the first barrier layer 36 covers the intermediate area of the second initial cap layer 343 to expose the edge area of the second initial cap layer 343, moreover, by increasing the carbon content of etching gas introduced into the reaction chamber, so as to increase etch selectivity ratio of the second core layer 34 and the first sidewall layer 35' to retain the first sidewall layer 35'. Due to the barrier function of the first sidewall layer 35', the formed second cap layer 343' has an inclined sidewall, and the top dimension of the second cap layer 343' is smaller than a bottom dimension of the second cap layer 343'. In the operation that the first mask layer 32 is etched with the first mask pattern M1 as a mask, the pattern of the second cap layer 343' is transferred to the first mask layer 32 to form the first cap layer 373 also having an inclined sidewall. Specifically, an angle between a direction of the inclined sidewall and the direction parallel to the surface of the substrate ranges from 20 degree to 70 degrees. The material of the first barrier layer 36 may be photoresist.

With reference again to FIG. 4, in one embodiment, the manufacturing method further includes: before the target layer 31 is formed on the substrate 20, a conductive layer 27 is formed on the substrate 20, a pattern transfer layer 28 is formed on the conductive layer 27, and a hard mask layer 29 is formed on the pattern transfer layer 28. The hard mask layer 29 is disposed below the target layer 31. The pattern formed on the target layer 31 can then be transferred to the conductive layer 27. According to the embodiments of the present disclosure, a multi-layer structure including the pattern transfer layer 28, the hard mask layer 29 and the target layer 31 is formed on the conductive layer 27, and the pattern of the upper layer is subsequently transferred to the target layer 31 and then transferred from the target layer 31 to the conductive layer 27. In this way, the accuracy of pattern transfer can be improved. The material of the conductive layer 27 includes, but is not limited to, titanium nitride. The material of the pattern transfer layer 28 may be an Advanced Patterning Film (APF) material. The material of the hard mask layer 29 includes, but is not limited to, nitrogen oxides such as silicon oxynitride.

Continuing with reference to FIG. 4, the manufacturing method further includes: before the conductive layer 27 is formed on the substrate 20,

- isolation structures 21 and multiple active areas AA separated by the isolation structures 21 are formed in the substrate 20, both of the isolation structures 21 and the multiple active areas AA are disposed in the array areas 201;
- multiple word line structures 22 extending along a third direction and a word line cap layer 23 covering the word line structures 22 are formed in the substrate 20 disposed in the array area 201;
- multiple bit line structures 24 extending along the fourth direction are formed on the array area 201;
- multiple isolation fences 25 extending along the third direction are formed on the array area 201 and the isolation fences 25 and the bit line structures 24 are arranged alternately; and
- an insulation layer 26 is formed on the peripheral area 202.

In an embodiment, the third direction and the fourth direction are arranged perpendicular to each other, and the first direction intersects with the third direction and the fourth direction.

It should be noted that FIG. 3 to FIG. 29 provided by the embodiments of the present disclosure are cross-sectional views taken along the direction along which the isolation fences 25 extend. In actual operation, the isolation fences 25 and the bit line structures 24 intersect each other to define multiple gaps where the active area AA is exposed and a part of the conductive layer 27 is located. In some embodiments, the manufacturing method further includes: before the conductive layer 27 is formed, contact plugs (not shown in the figures) are formed in the gaps, the bottom of each contact plugs (not shown in the figures) is electrically connected to the active area AA, and the top of each contact plug is electrically connected to the conductive layer 27. In the embodiments of the present disclosure, the isolation fences 25 and the insulation layer 26 may be formed in the same process operation and the materials of the isolation fences 25 and the insulation layer 26 may be nitrides, such as silicon nitride.

Figure 12:
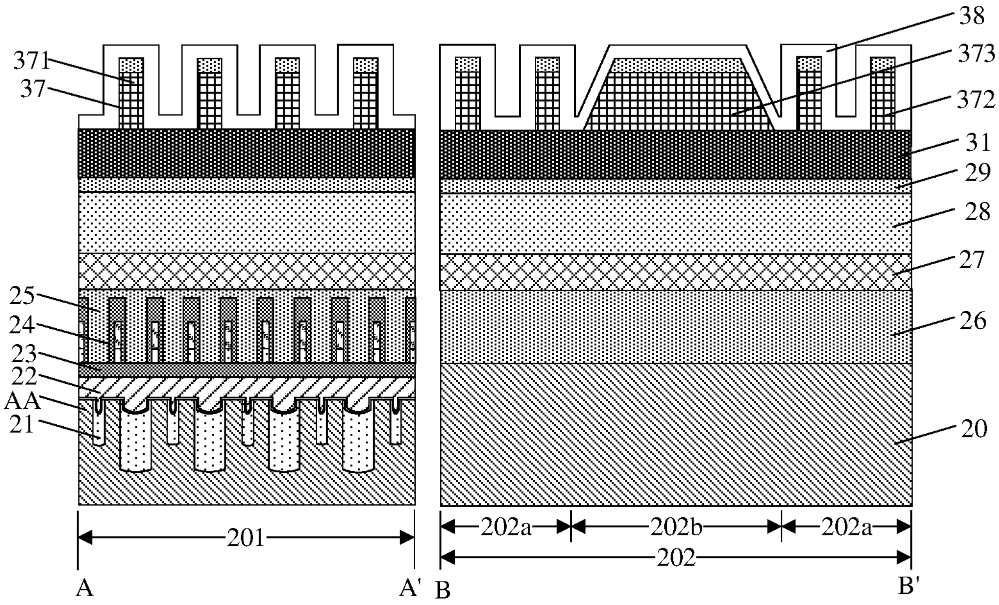

Secondly, the operation 103 is performed and as shown in FIG. 12, the first dielectric layer 38 covering the sidewall of the first core layer 37 is formed.

Specifically, the formation of the first dielectric layer 38 includes the formation of the first dielectric layer 38 covering the sidewall and an upper surface of the first core layer 37 and the upper surface of the target layer 31. The material of the first dielectric layer 38 includes an oxide such as silicon oxide.

Figure 13:
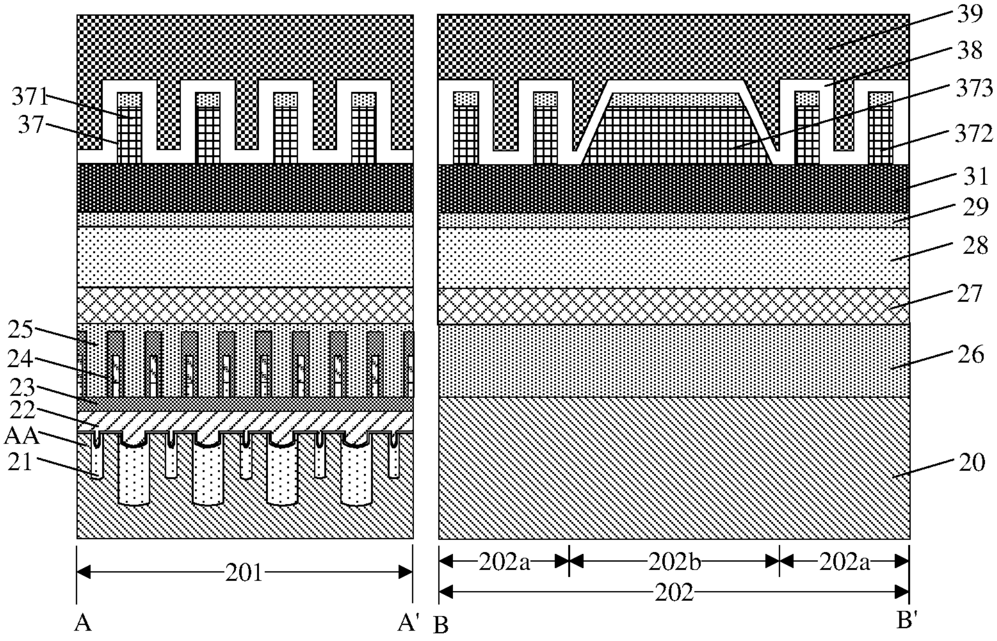

Thirdly, the operation 104 is performed and as shown in FIG. 13, a first filling layer 39 is formed to cover a surface of the first dielectric layer 38 and fill a gap in the first core layer 37.

The first filling layer 39 covers the first dielectric layer 38 and fills the gap in the first core layer 37. The first filling layer 39 may be the spin-coated hard mask layer including an amorphous carbon layer, an amorphous silicon layer or the like.

The first cap layer 373 provided by the embodiments of the present disclosure has functions of protecting the blank area **202*b* and supporting the first filling layer 39. In this way, a recess is avoided on the upper surface of the first filling layer 39 disposed on the blank area 202*b*, and the first filling layer 39 has a flat surface. When the target layer 31 disposed below the first filling layer 39 and the first core layer 37 is subsequently etched with the first filling layer 39 and the first core layer 37 as a mask, over-etching in the blank area 202*b*** can be avoided.

Figure 14:
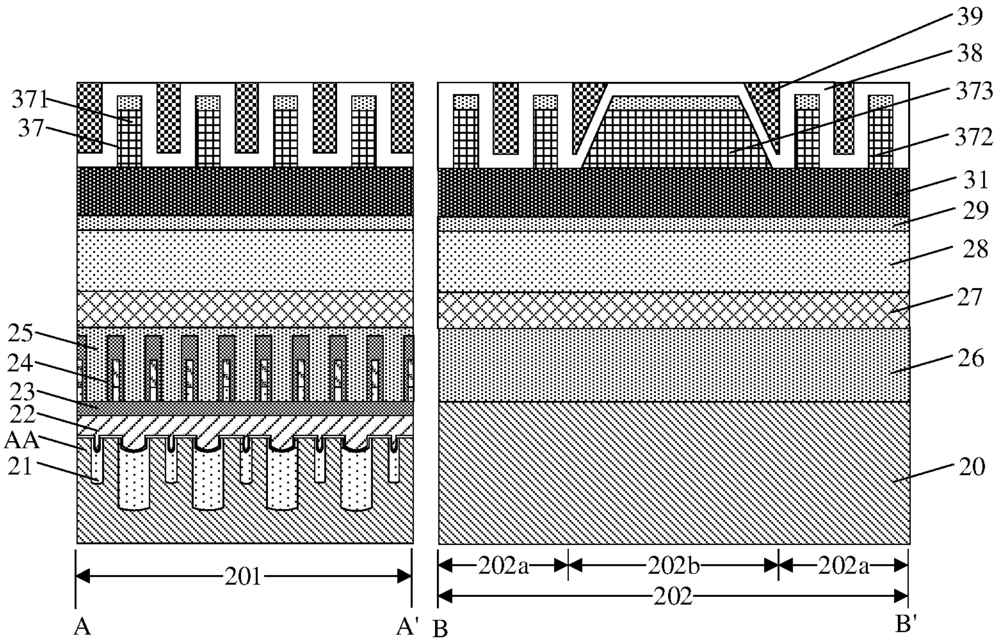
Figure 15:
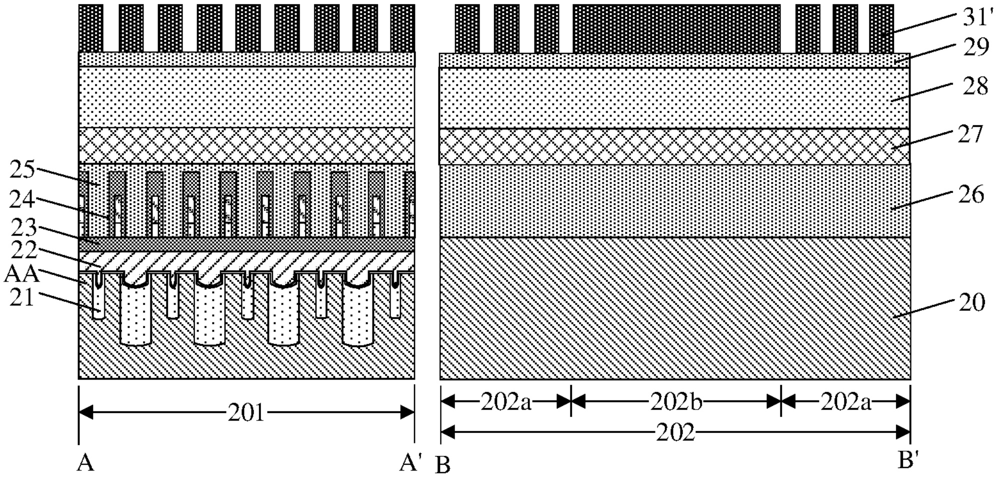

Fourthly, the operation 105 is performed, and as shown in FIG. 14 to FIG. 15, the first dielectric layer 38 and the target layer 31 are etched along the sidewall of the first array core layer 371 and the sidewall of the first mark core layer 372 to transfer the pattern of the first core layer 37 and the pattern of the first filling layer 39 to the target layer 31.

Specifically, the operation that, the first dielectric layer 38 and the target layer 31 are etched along the sidewall of the first array core layer 371 and the sidewall of the first mark core layer 372 to transfer the pattern of the first core layer 37 and the pattern of the first filling layer 39 to the target layer 31, includes following operations.

The first filling layer 39 is etched back until an upper surface of the first dielectric layer 38 is exposed (as shown in FIG. 14).

The first dielectric layer 38 and the target layer 31 are etched with the first filling layer 39 and the first core layer 37 as a mask, so as to transfer the pattern of the first core layer 37 and the pattern of the first filling layer 39 to the target layer 31 to form an initial target pattern 31' (as shown in FIG. 15).

According to the embodiments of the present disclosure, the first cap layer 373 formed on the blank area **202*b* has an inclined sidewall and a top dimension of the first cap layer 373 is smaller than a bottom dimension of the first cap layer 373. Specifically, an angle between a direction of the inclined sidewall and the direction parallel to the surface of the substrate 20 ranges from 20 degrees to 70 degrees. In this way, the target layer 31 is prevent from being etched downwards along the sidewall of the first cap layer 373**, and errors of the pattern transfer can be avoided.

As shown in FIG. 2, in an embodiment, the initial target pattern 31' disposed in the array area 301 extends along the first direction, and the extension direction of the initial target pattern 31' disposed in the mark area **202*a* may be identical to the extension direction of initial target pattern 31' disposed in the array area 201, or the extension direction of the initial target pattern 31' disposed in the mark area 202*a* may be different from the extension direction of initial target pattern 31' disposed in the array area 201**.

Then, as shown in FIG. 16 to FIG. 28, the manufacturing method further includes the following operations after the initial target pattern 31' is formed.

A buried layer 41 filling a gap in the initial target pattern 31 (as in FIG. 16) is formed.

A third core layer 47 is formed on the initial target pattern 31' and the buried layer 41. The third core layer 47 includes third array core layer 471 on the array area 201, a third cap layer 472 on the peripheral area 202. The third array core layer 471 extends along a second direction intersecting the first direction, the third cap layer 472 has an inclined sidewall, and a top dimension of the third cap layer 472 is smaller than a bottom dimension of the third cap layer 472 (as shown in FIG. 17 to FIG. 24). Specifically, an angle between a direction of the inclined sidewall and the direction parallel to the surface of the substrate 20 ranges from 20 degrees to 70 degrees.

Figure 25:
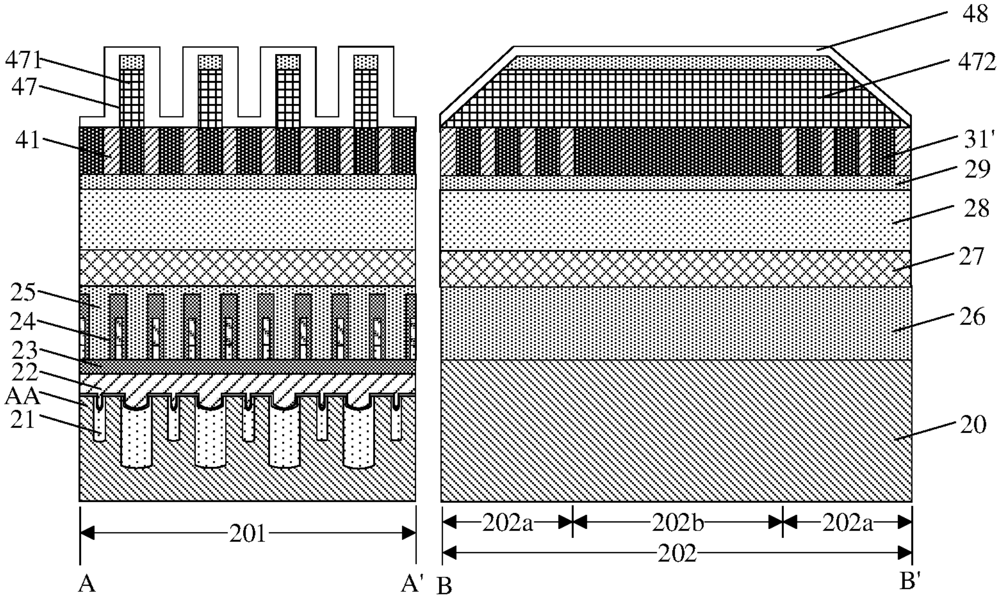

A third dielectric layer 48 covering a sidewall of the third core layer 47 is formed (as shown in FIG. 25).

Figure 26:
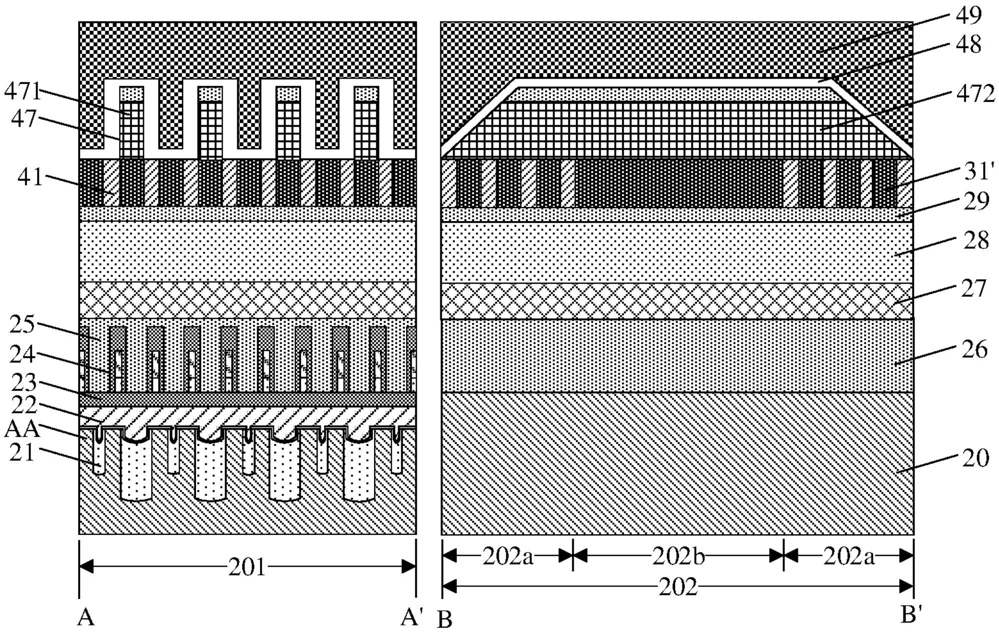

A second filling layer 49 is formed. The second filling layer 49 covers a surface of the third dielectric layer 48 and fills a gap in the third core layer 47 (as shown in FIG. 26).

Figure 27:
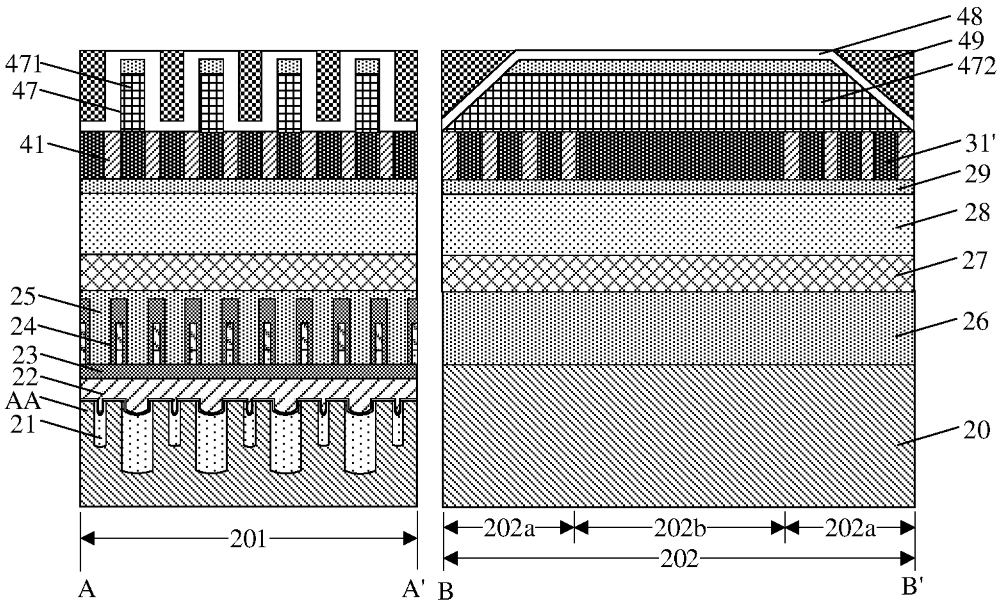
Figure 28:
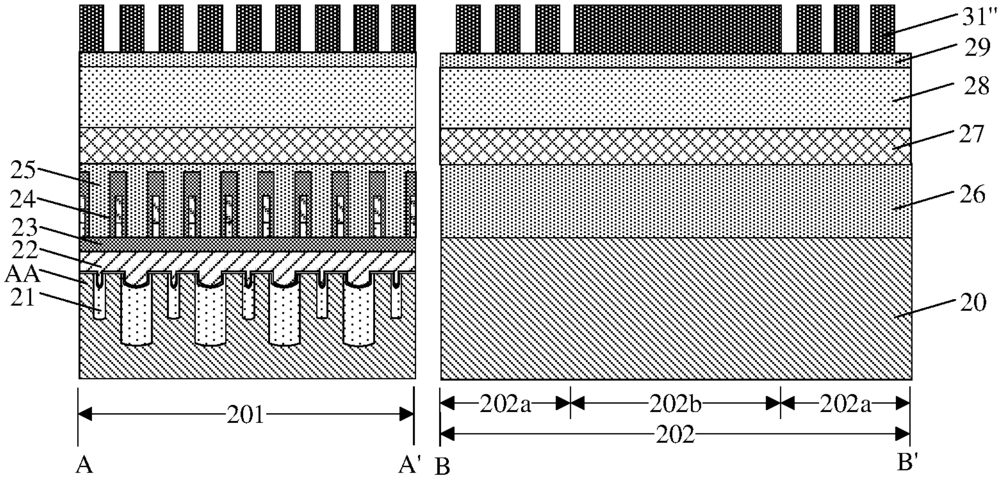

The third dielectric layer 48 and the initial target pattern 31' are etched along a sidewall of the third array core layer 471 to transfer the pattern of the second filling layer 49 and the pattern of the third core layer 47 to the initial target pattern 31' to form the target pattern 31" (as shown in FIG. 27 to FIG. 28).

With reference to FIG. 17 to FIG. 24 again, the operation that the third core layer 47 is formed on the initial target pattern 31' and the buried layer 41 includes following operations.

Figure 17:
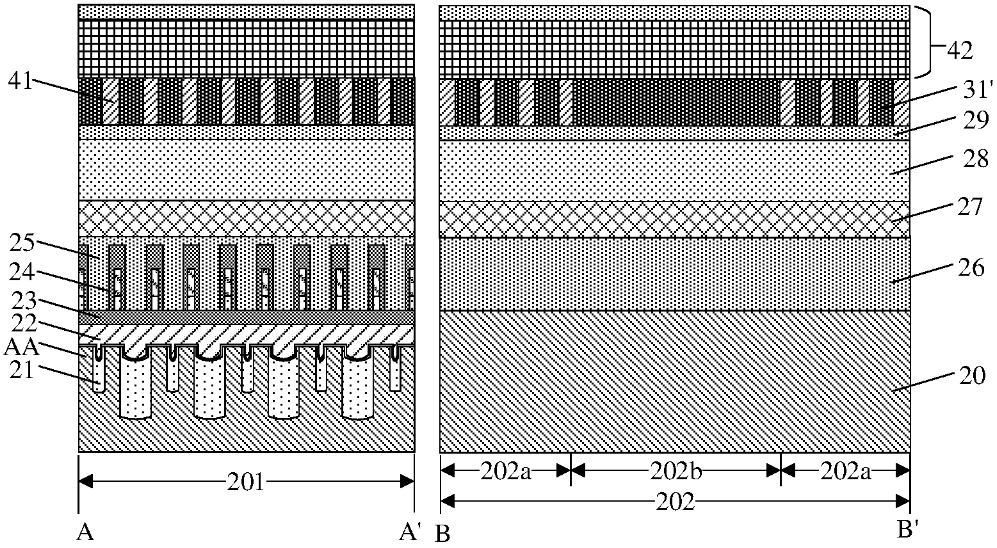

A third mask layer 42 is formed on the initial target pattern 31' and the buried layer 41 (as shown in FIG. 17).

Second mask pattern M2 is formed on the third mask layer 42. The second mask pattern M2 includes a second sidewall layer 45' disposed on the array area 201, and a fourth cap layer 442' disposed on the peripheral area 202. The fourth cap layer 442' has an inclined sidewall, and a top dimension of the fourth cap layer 442' is smaller than a bottom dimension of the fourth cap layer 442' (as shown in FIG. 18 to FIG. 23). Specifically, an angle between a direction of the inclined sidewall and the direction parallel to the surface of the substrate 20 ranges from 20 degrees to 70 degrees.

Figure 24:
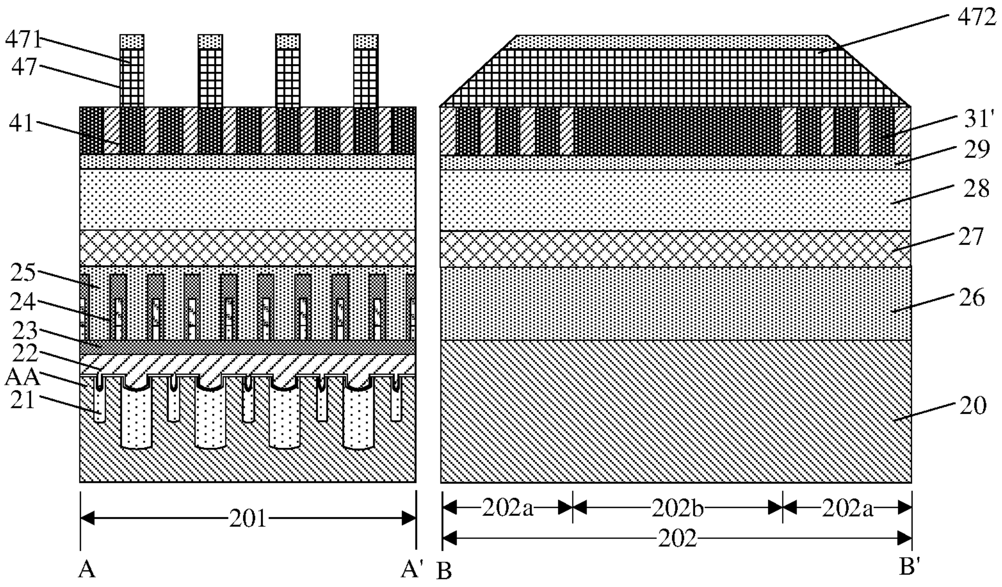

The third mask layer 42 is etched with the second mask pattern M2 as a mask to form third array core layer 471 and a third cap layer 472 respectively on the array area 201 and the peripheral area 202 (as shown in FIG. 24).

Continuing with reference to FIG. 18 to FIG. 23, the operation that the second mask pattern M2 is formed on the third mask layer 42 includes following operations.

Figure 18:
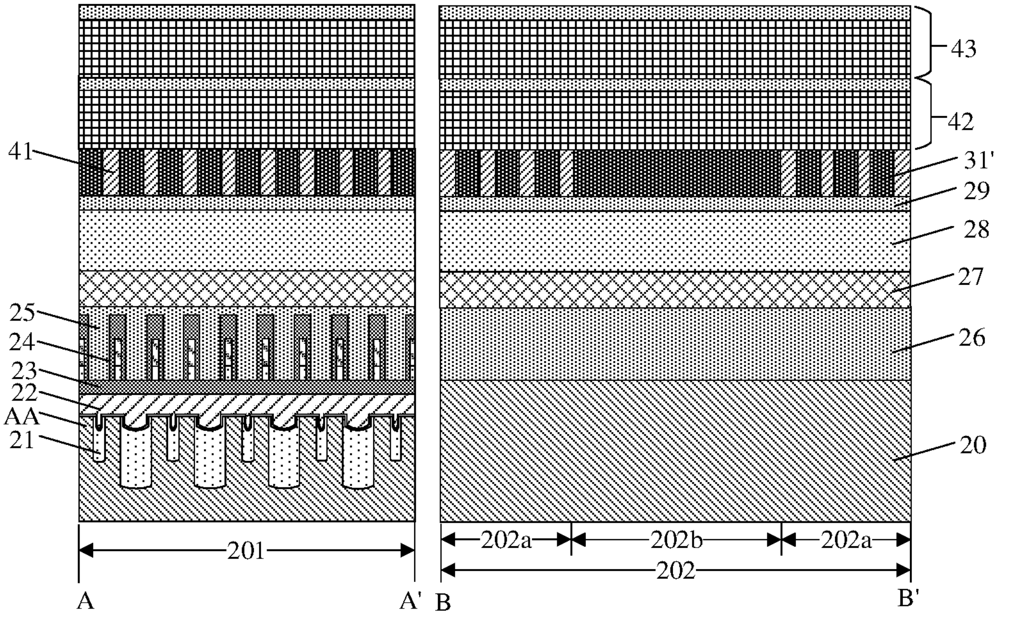

A fourth mask layer 43 is formed on the third mask layer 42 (as shown in FIG. 18).

Figure 19:
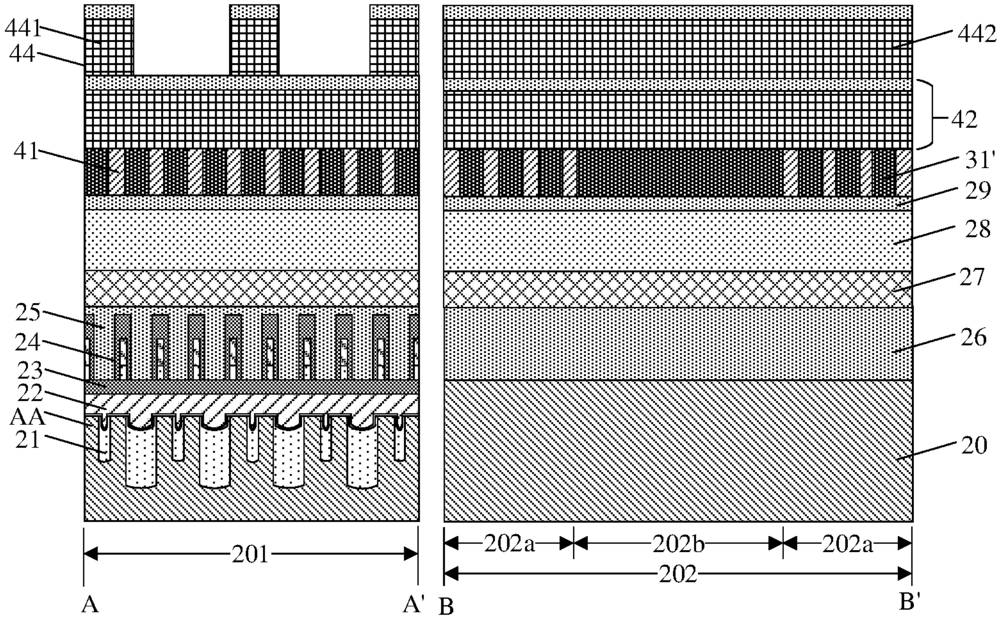
Figure 20:
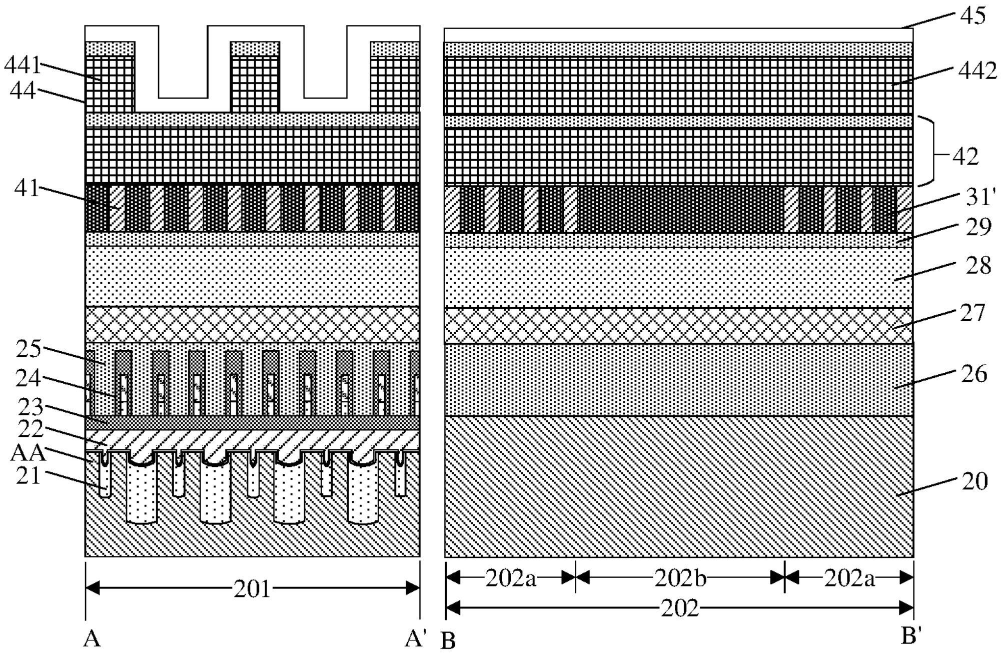

The fourth mask layer 43 is etched to form a fourth core layer 44. The fourth core layer 44 includes fourth array core layer 441 on the array area 201, and a fourth initial cap layer 442 on the peripheral area 202, where the fourth array core layer 441 extends along the second direction (as shown in FIG. 19);

A fourth dielectric layer 45 is formed. The fourth dielectric layer 45 covers a sidewall and an upper surface of the fourth core layer and an upper surface of the third mask layer 42 (as shown in FIG. 20).

Figure 21:
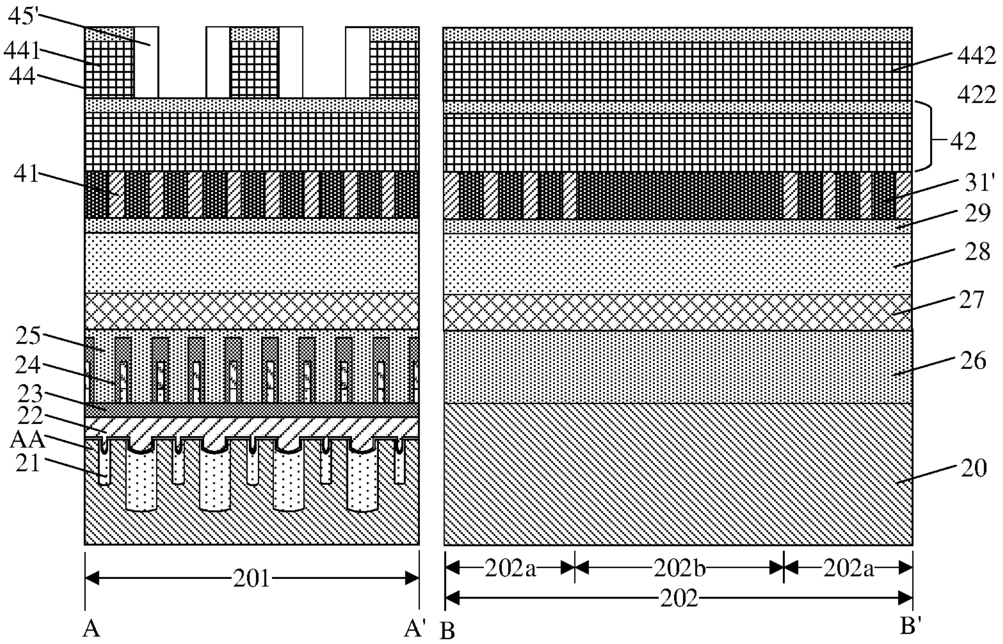

The fourth dielectric layer 45 is etched to form the second sidewall layer 45' covering the sidewall of the fourth core layer 44 (as shown in FIG. 21).

Figure 22:
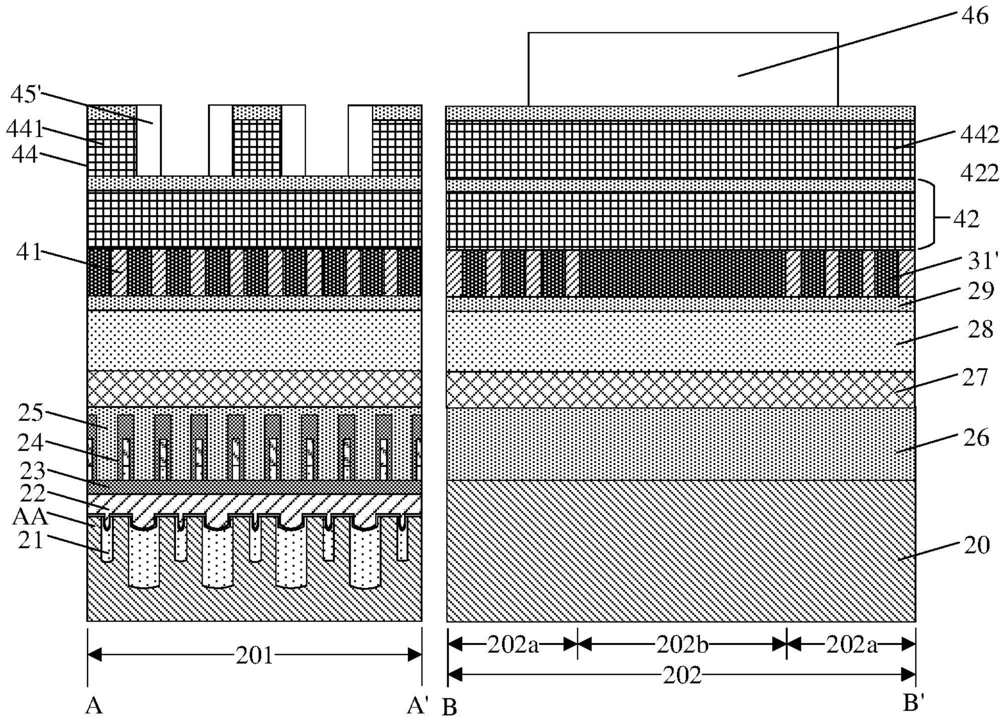

A second barrier layer 46 covering an intermediate area of the fourth initial cap layer 442 is formed (as shown in FIG. 22).

Figure 23:
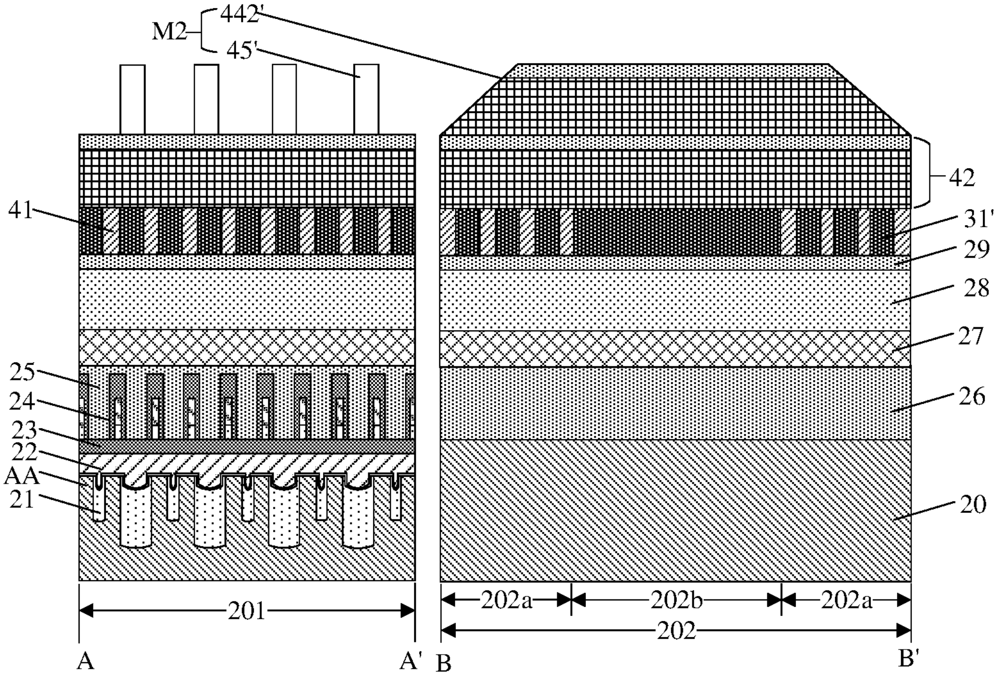

The fourth array core layer 441 and the fourth initial cap layer 442 are etched with the second barrier layer 46 as a mask, so as to remove the fourth array core layer 441 and form the fourth cap layer 442' (as shown in FIG. 23).

As shown in FIG. 2, the third array core layer 471 is disposed on the initial target pattern 31' and the buried layer 41, the initial target pattern 31' disposed on the array area 201 extends along the first direction, and the third array core layer 471 extends along the second direction. The first direction may be oblique to the second direction, and the second direction intersects the third direction and the fourth direction. The buried layer 41 may be a spin-coated hard mask layer including an amorphous carbon layer, an amorphous silicon layer or the like. The third mask layer 42, the fourth mask layer 43, the third core layer 47 and the fourth core layer 44 may all have a double-layer structure, and the materials of the third mask layer 42, the fourth mask layer 43 may be the identical to the materials of the first mask layer 32, and the materials of the third core layer 47 and the fourth core layer 44 may be identical to the material of the first core layer 37.

It can be appreciated that, although not shown in the figures, the second sidewall layer 45' also covers the sidewall of the fourth initial cap layer 442 and the fourth array core layer 441 and the fourth initial cap layer 442 may be etched by using a chemical gas etching process. Specifically, the embodiments of the present disclosure adopt the scheme that the second barrier layer 46 covers the intermediate area of the fourth initial cap layer 442 to expose the edge area of the fourth initial cap layer 442, moreover, by increasing the carbon content of etching gas introduced into the reaction chamber, so as to increase etch selection ratio of the fourth core layer 44 and the second sidewall layer 45' to retain the second sidewall layer 45'. Due to the barrier function of the second sidewall layer 45', the formed fourth cap layer 442' has an inclined sidewall and the top dimension of the fourth cap layer 442' is smaller than a bottom dimension of the fourth cap layer 442'. In this way, in the operation that the third mask layer 42 is etched with the second mask pattern M2 as a mask, the pattern of the fourth cap layer 442' is transferred to the third mask layer 42 to form the third cap layer 472 also having an inclined sidewall. Specifically, an angle between a direction of the inclined sidewall and the direction parallel to the surface of the substrate 20 ranges from 20 degrees to 70 degrees. The material of the fourth dielectric layer 45 includes an oxide, for example, silicon oxide. The material of the second barrier layer 46 may be identical to the material of the first barrier layer 36.

As shown in FIG. 25, in one embodiment, the third dielectric layer 48 covers the sidewall and the upper surface of the third core layer 47 and the upper surface of the buried layer 41 and the upper surface of the initial target pattern 31'. The material of the third dielectric layer 48 includes, but is not limited to, an oxide such as silicon oxide.

With reference to FIG. 26 to FIG. 28 again, the operation that the third dielectric layer 48 and the initial target pattern 31' are etched along a sidewall of the third array core layer 471 to transfer the pattern of the second filling layer 49 and the pattern of the third core layer 47 to the initial target pattern 31' to form the target pattern 31" includes: the second filling layer 49 is etched back until an upper surface to the third dielectric layer 48 is exposed; and the third dielectric layer 48 and the initial target pattern 31' are etched with the second filling layer 49 and the third core layer 47 as a mask, so as to transfer the pattern of the third core layer 47 and the pattern of the second filling layer 49 to the initial target pattern 31' to form the target pattern 31". The second filling layer 49 may be a spin-coated hard mask layer including an amorphous carbon layer, an amorphous silicon layer or the like.

The third core layer 47 provided by the embodiments of the present disclosure includes the third cap layer 472 on the peripheral area 202. The third cap 472 has a function of protecting the peripheral area 202, and due to the supporting function of the third cap layer 472, a recess will not be formed on the upper surface of the second filling layer 49 disposed in the peripheral area 202. In this way, when the initial target pattern 31' disposed below the third core layer 47 is etched, the initial target pattern 31' or other layer disposed below the initial target pattern 31' can be prevented from being damaged by over-etching in the peripheral area 202; moreover, the third cap layer 472 has an inclined sidewall, and a top dimension of the third cap layer 472 is smaller than a bottom dimension of the third cap layer 472. Specifically, an angle between a direction of the inclined sidewall and the direction parallel to the surface of the substrate 20 ranges from 20 degrees to 70 degrees. In this way, the target layer is prevent from being etched downwards along the sidewall of the first cap layer can be avoided and errors of the pattern transfer can be avoided.

Figure 29:
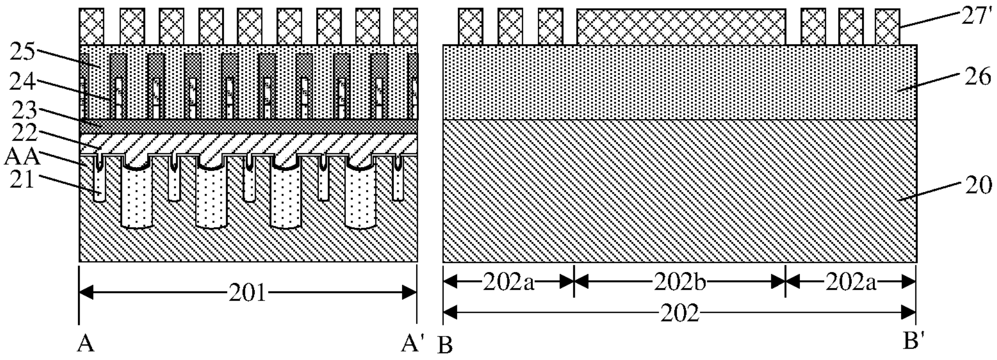

Then, as shown in FIG. 29, the manufacturing method further includes: after the target pattern 31" is formed, the hard mask layer 29, the pattern transfer layer 28, and the conductive layer 27 are etched downwards with the target pattern 31" as a mask, to transfer the pattern of the target pattern 31" to the conductive layer 27. In some embodiments, before the operation of the etching downwards, the buried layer 41 and other layer on the target pattern 31" and the buried layer 41, such as the third core layer 47, the second filling layer 49, etc. are also removed.

As shown in FIG. 29, the pattern of the target pattern 31" is transferred to the conductive layer 27 to form the conductive pattern 27', the conductive pattern 27' on the mark area 202*a* forms an alignment mark, the conductive pattern 27' on the array area 201 forms a contact pad, and subsequently a capacitor structure electrically connected to the contact pad may be formed on the substrate 20.

It should be noted that those skilled in the art are able to make possible changes between the above sequence of operations without departing from the scope of the present disclosure.

Embodiments of the present disclosure also provide a semiconductor structure, as shown in FIG. 13, the semiconductor structure includes: a substrate 20 including an array area 201 and a peripheral area 202, where the peripheral area 202 includes a mark area 202*a* and a blank area 202*b* adjoining the mark area 202*a*; a target layer 31 and a first core layer 37 disposed on the target layer 31, the first core layer 37 including a first array core layer 371 disposed on the array area 201, first mark core layer 372 disposed on the mark area 202*a* and a first cap layer 373 disposed on the blank area 202*b*, where the first cap layer 373 has an inclined sidewall, and a top dimension of the first cap layer 373 is smaller than a bottom dimension of the first cap layer 373. Specifically, the angle between the direction of the inclined sidewall and the direction parallel to the surface of the substrate ranges from 20 degrees to 70 degrees; a first dielectric layer 38 covering a sidewall of the first core layer 37; and a first filling layer 39 disposed on the first dielectric layer 38 and in the first core layer 37.

The substrate 20 may be a semiconductor substrate and may include at least one elemental semiconductor material (e.g. silicon (Si) substrate, germanium (Ge) substrate), at least one III-V compound semiconductor material, at least one II-VI compound semiconductor material, at least one organic semiconductor material, or other semiconductor materials known in the art. In one specific embodiment, the substrate 20 is the silicon substrate and the silicon substrate may be doped or may not be doped. In actual operation, the semiconductor structure is formed on the wafer, the mark area 202*a* may be disposed on dicing channels of the wafer and alignment marks may subsequently be formed on the mark area 202*a*.

The target layer 31 can be used as a mask layer, and the pattern of the upper layer can be transferred to the target layer 31, and then the pattern of the target layer 31 can be transferred to the next layer. The material of the target layer 31 includes, but is not limited to, an oxide, for example silicon oxide.

In an embodiment the first core layer 37 includes a body layer (not identified) and a cap layer (not identified) covering an upper surface of the body layer. In some embodiments, the first array core layer 371 extends along the first direction, and the extension direction of the first mark core layer 372 may be identical to the extension direction of the first array core layer 371, or the extension directions of the first mark core layer 372 may be different from the extension direction of the first array core layer 371. The material of the body layer (not identified) may be a spin-coated hard mask layer including an amorphous carbon layer, an amorphous silicon layer, or the like. The material of the cap layer (not identified) can be silicon oxynitride.

In one embodiment, the first dielectric layer 38 covers the sidewall and the upper surface of the first core layer 37 and the upper surface of the target layer 31. The material of the first dielectric layer 38 includes, but is not limited to, an oxide such as silicon oxide. The first filling layer 39 may be a spin-coated hard mask layer including the amorphous carbon layer, the amorphous silicon layer or the like.

In the embodiments of the present disclosure, the first cap layer 373 has a function of protecting the blank area 202*b*, and due to the supporting function of the first cap layer 373, when the first filling layer 39 is formed on the target layer 31 and the first core layer 37, the recess will not be formed on the upper surface of the first filling layer 39 disposed in the blank area 202*b*, and the first filling layer 39 has a flat upper surface. Subsequently, the first dielectric layer 38 and the target layer 31 can be etched with the first filling layer 39 and the first core layer 37 as a mask, so that over-etching in the blank area 202*b* can be avoided. Moreover, the first cap layer 373 has an inclined sidewall and a top dimension of the first cap layer 373 is smaller than a bottom dimension of the first cap layer 373. Specifically, the angle between the direction of the inclined sidewall and the direction parallel to the surface of the substrate 20 ranges from 20 degrees to 70 degrees. In this way, the target layer 31 is prevent from being etched downwards along the sidewall of the first cap layer 373, and errors of the pattern transfer are avoided.

In an embodiment, the semiconductor structure further includes a conductive layer 27 disposed on the substrate 20; a pattern transfer layer 28 disposed on the conductive layer 27; and a hard mask layer 29 disposed on the pattern transfer layer 28 and below the target layer 31. The pattern formed on the target layer 31 can then be transferred to the conductive layer 27. According to the embodiments of the present disclosure, a multi-layer structure including the pattern transfer layer 28, the hard mask layer 29 and the target layer 31 are formed on the conductive layer 27, and the pattern of the upper layer is subsequently transferred to the target layer 31 and then transferred from the target layer 31 to the conductive layer 27, in this way, the accuracy of pattern transfer can be improved. The material of the conductive layer 27 includes, but is not limited to, titanium nitride. The material of the pattern transfer layer 28 may be an Advanced Patterning Film (APF) material. The material of the hard mask layer 29 includes, but is not limited to, nitrogen oxides such as silicon oxynitride.

In one embodiment, the semiconductor structure further includes: an isolation structure 21 disposed in the substrate 20, where multiple active areas AA are separated by the isolation structures 21 in the substrate 20, and both of the isolation structures 21 and the multiple active areas AA are disposed in the array areas 201; multiple word line structures 22 extending along the third direction and a word line cap layer 23 covering the word line structures 22, where the multiple word line structures 22 and the word line cap layer 23 are disposed in the substrate 20 of the array area 201; multiple bit line structures 24 extending along the fourth direction and disposed on the array area 201; multiple isolation fences 25 extending along the third direction and disposed on the array area 201, where the isolation fences 25 and the bit line structures 24 are arranged alternately; and an insulation layer 26 disposed on the peripheral area 202. In some embodiments, the third and fourth directions are perpendicular to each other and the first direction intersects the third direction and fourth direction.

It should be noted that FIG. 13 provided by the embodiments of the present disclosure is a cross-sectional view taken along the direction along which the isolation fences 25 extend. In actual operation, the isolation fences 25 and the bit line structures 24 intersect each other to define multiple gaps where the active area AA is exposed and a part of the conductive layer 27 is located. In some embodiments, the semiconductor structure further includes contact plugs (not shown in the figures) located in the gaps. The bottom of each contact plug (not shown in the figures) is electrically connected to the active area AA, and the top of each contact plug is electrically connected to the conductive layer 27.

In one embodiment, in actual operation, the first filling layer 39 can be subsequently etched back until the upper surface of the first dielectric layer 38 is exposed, so that a structure as shown in FIG. 14 can be formed; then, the first dielectric layer 38 and the target layer 31 are etched with the first filling layer 39 and the first core layer 37 as the mask, so as to transfer the pattern of the first core layer 37 and the pattern of the first filling layer 39 to the target layer 31 and form the initial target pattern 31', so that a structure as shown in FIG. 15 can be formed.

Figure 16:
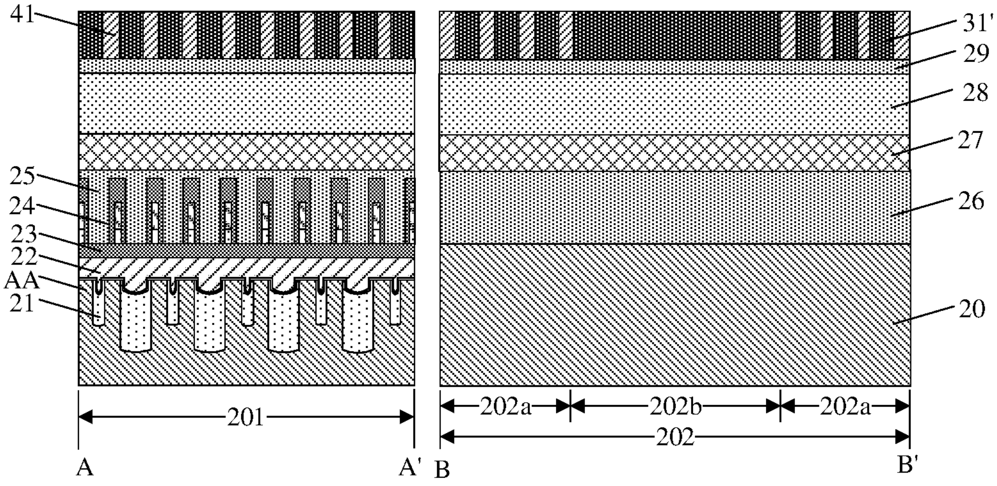

In an embodiment, in actual operation, the buried layer 41 can be formed subsequently, where the buried layer 41 fills the gap in the initial target pattern 31', so that a structure as shown in FIG. 16 can be formed. Then, third core layer 47 is formed on the initial target pattern 31' and the buried layer 41. The third core layer 47 includes third array core layer 471 on the array area 201, the third cap layer 472 on the peripheral area 202. The third array core layer 471 extends along a second direction intersecting the first direction, the third cap layer 472 has an inclined sidewall, and a top dimension of the third cap layer 472 is smaller than a bottom dimension of the third cap layer 472, so that a structure as shown in FIG. 24 can be formed. Specifically, an angle between the direction of the inclined sidewall of the third cap layer 472 and the direction parallel to the surface of the substrate 20 ranges from 20 degrees to 70 degrees. As shown in FIG. 2, the third array core layer 471 is disposed on the initial target pattern 31' and the buried layer 41, the initial target pattern 31' disposed on the array area 201 extends along the first direction, and the third array core layer 471 extends along the second direction. The first direction may be oblique to the second direction, and the second direction intersects the third direction and the fourth direction.

In actual operation, the third dielectric layer 48 can be formed subsequently, where the third dielectric layer 48 covers the sidewall of the third core layer 47, so that a structure as shown in FIG. 25 can be formed; then, a second filling layer 49 is formed, where the second filling layer 49 covers the surface of the third dielectric layer 48 and fills a gap in the third core layer 47, so that a structure as shown in FIG. 26 can be formed; and then, the third dielectric layer 48 and the initial target pattern 31' are etched along a sidewall of the third array core layer 471 to transfer the pattern of the second filling layer 49 and the pattern of the third core layer 47 to the initial target pattern 31' to form the target pattern 31", so that the structure as shown in FIG. 28 can be formed.

Herein, the third core layer 47 includes the third cap layer 472 on the peripheral area 202. The third cap 472 has a function of protecting the peripheral area 202, and due to the supporting function of the third cap layer 472, a recess will not be formed on the upper surface of the second filling layer 49 disposed in the peripheral area 202. In this way, when the initial target pattern 31' disposed below the third core layer 47 is etched, the initial target pattern 31' or other layer disposed below the initial target pattern 31' can be prevented from being damaged by over-etching in the peripheral area 202; moreover, the third cap layer 472 has an inclined sidewall, and a top dimension of the third cap layer 472 is smaller than a bottom dimension of the third cap layer 472. Specifically, an angle between a direction of the inclined sidewall and the direction parallel to the surface of the substrate 20 ranges from 20 degrees to 70 degrees. In this way, the target layer is prevented from being etched downwards along the sidewall of the first cap layer and errors of the pattern transfer can be avoided.

In one embodiment, in actual operation, the hard mask layer 29, the pattern transfer layer 28, and the conductive layer 27 are etched downwards with the target pattern 31" as a mask, to transfer the pattern of the target pattern 31" to the conductive layer 27, thus the structure as shown in FIG. 29 can be formed. The conductive pattern 27' on the mark area **202*a* forms an alignment mark, the conductive pattern 27' on the array area 201 forms the contact pad, and subsequently a capacitor structure electrically connected to the contact pad may be formed on the substrate 20**.

According to the semiconductor structure and the manufacturing method of a semiconductor structure provided by the embodiments of the present disclosure, the manufacturing method includes: providing the substrate including the array area and the peripheral area, where the peripheral area includes a mark area and the blank area adjoining the mark area; forming, on the substrate, the target layer and the first core layer disposed on the target layer, the first core layer including a first array core layer disposed on the array area, a first mark core layer disposed on the mark area and the first cap layer disposed on the blank area, where the first cap layer has an inclined sidewall, and the top dimension of the first cap layer is smaller than the bottom dimension of the first cap layer; forming the first dielectric layer covering a sidewall of the first core layer; forming the first filling layer that covers the surface of the first dielectric layer and fills the gap in the first core layer; and etching the first dielectric layer and the target layer along a sidewall of the first array core layer and a sidewall of the first mark core layer to transfer a pattern of the first core layer and a pattern of the first filling layer to the target layer. The first core layer provided by the embodiments of the present disclosure includes the first cap layer disposed on the blank area. The first cap layer has a function of protecting the blank area, and due to the supporting function of the first cap layer, a recess will not be formed on the upper surface of the first filling layer disposed in the blank area. In this way, when the target layer disposed below the first core layer is etched, the target layer or other layer disposed below the target layer can be prevented from being damaged by over-etching in the blank area; moreover, the first cap layer has an inclined sidewall, and a top dimension of the first cap layer is smaller than a bottom dimension of the first cap layer, thus the target layer is prevent from being etched downwards along the sidewall of the first cap layer and errors of the pattern transfer can be avoided.

The above is only the preferred embodiments of the preset disclosure, and is not intended to limit the scope of protection of the preset disclosure. Any modification, equivalent replacement and improvement made within the spirit and principles of this application shall be included in the scope of protection of this application.

The invention claimed is:

1. A manufacturing method of a semiconductor structure, comprising:

providing a substrate comprising an array area and a peripheral area, wherein the peripheral area comprises a mark area and a blank area adjoining the mark area;

forming, on the substrate, a target layer and a first core layer disposed on the target layer, the first core layer comprising a first array core layer disposed on the array area, a first mark core layer disposed on the mark area and a first cap layer disposed on the blank area, where the first cap layer has an inclined sidewall, and a top dimension of the first cap layer is smaller than a bottom dimension of the first cap layer;

forming a first dielectric layer covering a sidewall of the first core layer;

forming a first filling layer that covers a surface of the first dielectric layer and fills a gap in the first core layer; and etching the first dielectric layer and the target layer along a sidewall of the first array core layer and a sidewall of the first mark core layer to transfer a pattern of the first core layer and a pattern of the first filling layer to the target layer.

2. The manufacturing method of claim 1, wherein forming, on the substrate, the first core layer disposed on the target layer comprises:

forming a first mask layer on the target layer;

forming a first mask pattern on the first mask layer, wherein the first mask pattern comprises a first sidewall layer disposed on the array area and the mark area and a second cap layer disposed on the blank area, wherein the second cap layer has an inclined sidewall, and a top dimension of the second cap layer is smaller than a bottom dimension of the second cap layer; and etching the first mask layer with the first mask pattern as a mask to form the first array core layer, the first mark core layer and the first cap layer respectively on the array area, the mark area and the blank area.

3. The manufacturing method of claim 2, wherein forming the first mask pattern on the first mask layer comprises:

forming a second mask layer on the first mask layer;

etching the second mask layer to form a second core layer, wherein the second core layer comprises a second array core layer on the array area, a second mark core layer on the mark area, and a second initial cap layer on the blank area;

forming a second dielectric layer covering a sidewall and an upper surface of the second core layer and an upper surface of the first mask layer;

etching back the second dielectric layer to form the first sidewall layer covering the sidewall of the second core layer;

forming a first barrier layer covering an intermediate area of the second initial cap layer; and etching the second array core layer, the second mark core layer and the second initial cap layer with the first barrier layer as a mask, so as to remove the second array core layer and the second mark core layer and form the second cap layer.

4. The manufacturing method of claim 1, wherein forming the first dielectric layer covering the sidewall of the first core layer comprises:

forming the first dielectric layer covering the sidewall and an upper surface of the first core layer and an upper surface of the target layer.

5. The manufacturing method of claim 4, wherein etching the first dielectric layer and the target layer along the sidewall of the first array core layer and the sidewall of the first mark core layer to transfer the pattern of the first core layer and the pattern of the first filling layer to the target layer comprises:

etching back the first filling layer until an upper surface of the first dielectric layer is exposed; and etching the first dielectric layer and the target layer with the first filling layer and the first core layer as a mask, so as to transfer the pattern of the first core layer and the pattern of the first filling layer to the target layer and form an initial target pattern.

6. The manufacturing method of claim 5, wherein the first array core layer extends along a first direction, and the manufacturing method further comprises:

after the initial target pattern is formed, forming a buried layer filling a gap in the initial target pattern;

forming, on the initial target pattern and the buried layer, a third core layer comprising a third array core layer on the array area and a third cap layer on the peripheral area, wherein the third array core layer extends along a second direction intersecting the first direction, the third cap layer has an inclined sidewall, and a top dimension of the third cap layer is smaller than a bottom dimension of the third cap layer;

forming a third dielectric layer covering a sidewall of the third core layer;

forming a second filling layer that covers a surface of the third dielectric layer and fills a gap in the third core layer; and etching the third dielectric layer and the initial target pattern along a sidewall of the third array core layer to transfer a pattern of the second filling layer and a pattern of the third core layer to the initial target pattern to form a target pattern.

7. The manufacturing method of claim 6, wherein forming, on the initial target pattern and the buried layer, the third core layer comprising the third array core layer on the array area and the third cap layer on the peripheral area comprises:

forming a third mask layer on the initial target pattern and the buried layer;

forming, on the third mask layer, a second mask pattern comprising a second sidewall layer on the array area and a fourth cap layer on the peripheral area, wherein the fourth cap layer has an inclined sidewall, and a top dimension of the fourth cap layer being smaller than a bottom dimension of the fourth cap layer; and etching the third mask layer with the second mask pattern as a mask, to form the third array core layer and the third cap layer respectively on the array area and the peripheral area.

8. The manufacturing method of claim 7, wherein forming, on the third mask layer, the second mask pattern comprising the second sidewall layer on the array area and the fourth cap layer on the peripheral area comprises:

forming a fourth mask layer on the third mask layer;

etching the fourth mask layer to form a fourth core layer, the fourth core layer comprising a fourth array core layer on the array area and a fourth initial cap layer on the peripheral area, wherein the fourth array core layer extends along the second direction;

forming a fourth dielectric layer covering a sidewall and an upper surface of the fourth core layer and an upper surface of the third mask layer;

etching back the fourth dielectric layer to form the second sidewall layer covering the sidewall of the fourth core layer;

forming a second barrier layer covering an intermediate area of the fourth initial cap layer; and etching the fourth array core layer and the fourth initial cap layer with the second barrier layer as a mask, so as to remove the fourth array core layer and form the fourth cap layer.

9. The manufacturing method of claim 6, further comprising: before forming the target layer on the substrate, forming a conductive layer on the substrate, forming a pattern transfer layer on the conductive layer, and forming a hard mask layer on the pattern transfer layer, wherein the hard mask layer is disposed below the target layer.

10. The manufacturing method of claim 9, further comprising: after etching the third dielectric layer and the initial target pattern along the sidewall of the third array core layer to transfer the pattern of the second filling layer and the pattern of the third core layer to the initial target pattern to form the target pattern, etching downwards the hard mask layer, the pattern transfer layer and the conductive layer with the target pattern as a mask to transfer the target pattern to the conductive layer.

* * * * *